(12) United States Patent
Dalton et al.

(10) Patent No.: US 7,435,676 B2
(45) Date of Patent: Oct. 14, 2008

(54) DUAL DAMASCENE PROCESS FLOW ENABLING MINIMAL ULK FILM MODIFICATION AND ENHANCED STACK INTEGRITY

(75) Inventors: Timothy J. Dalton, Ridgefield, CT (US); Nicholas C. Fuller, Ossining, NY (US); Satyanarayana V. Nitta, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 11/328,981

(22) Filed: Jan. 10, 2006

(65) Prior Publication Data

US 2007/0161226 A1 Jul. 12, 2007

(51) Int. Cl.
*H01L 21/4763* (2006.01)
(52) U.S. Cl. .................. 438/636; 438/637; 438/639; 257/E21.577; 257/E21.584
(58) Field of Classification Search ................. 438/622, 438/627, 628, 639, 636, 637; 257/E21.029, 257/E21.577, E21.584
See application file for complete search history.

(56) References Cited

U.S. PATENT DOCUMENTS

| 6,147,009 | A | 11/2000 | Grill et al. | |
|---|---|---|---|---|
| 6,312,793 | B1 | 11/2001 | Grill et al. | |
| 6,437,443 | B1 | 8/2002 | Grill et al. | |
| 6,441,491 | B1 | 8/2002 | Grill et al. | |
| 6,479,110 | B2 | 11/2002 | Grill et al. | |
| 6,497,963 | B1 | 12/2002 | Grill et al. | |
| 6,541,398 | B2 | 4/2003 | Grill et al. | |
| 6,734,096 | B2 | 5/2004 | Dalton et al. | |
| 6,818,552 | B2 * | 11/2004 | Daniels et al. | 438/638 |
| 6,838,300 | B2 * | 1/2005 | Jin et al. | 438/38 |
| 7,033,929 | B1 * | 4/2006 | Burke et al. | 438/638 |
| 7,129,162 | B2 * | 10/2006 | Hong et al. | 438/637 |
| 7,232,748 | B2 * | 6/2007 | Ali | 438/618 |
| 2002/0119664 | A1 * | 8/2002 | Annapragada et al. | 438/700 |
| 2003/0008490 | A1 * | 1/2003 | Xing et al. | 438/622 |
| 2004/0185655 | A1 * | 9/2004 | Jiang et al. | 438/636 |
| 2005/0087516 | A1 * | 4/2005 | Duerksen et al. | 216/62 |
| 2005/0245100 | A1 * | 11/2005 | Wu et al. | 438/790 |

* cited by examiner

*Primary Examiner*—Scott B. Geyer
*Assistant Examiner*—Seahvosh J Nikmanesh
(74) *Attorney, Agent, or Firm*—Scully, Scott, Murphy & Presser, P.C.; Robert M. Trepp, Esq.

(57) ABSTRACT

Interconnect structures possessing an organosilicate glass interlayer dielectric material with minimal stoichiometeric modification and optionally an intact organic adhesion promoter for use in semiconductor devices are provided herein. The interconnect structure is capable of delivering improved device performance, functionality and reliability owing to the reduced effective dielectric constant of the stack compared with that of those conventionally employed because of the use of a sacrificial polymeric material deposited onto the dielectric and optional organic adhesion promoter during the barrier open step done prior to ashing the patterning material. This sacrificial film protects the dielectric and optional organic adhesion promoter from modification/consumption during the subsequent ashing step during which the polymeric film is removed.

9 Claims, 6 Drawing Sheets

DUAL DAMASCENE PROCESS FLOW ENABLING MINIMAL ULK FILM MODIFICATION AND ENHANCED STACK INTEGRITY

FIELD OF THE INVENTION

The present invention generally relates to integrated circuits (ICs), and more particularly to interconnect structures, including multilevel interconnect structures, in which advanced dual damascene processing enables target ultra low k (ULK) interconnect performance and enhanced mechanical integrity (reliability). The terms "ultra low k" or "ULK" refer to an organosilicate glass having a dielectric constant of less than 3.0. The present invention also provides a method of fabricating an interconnect structure in which wall portions of the organosilicate glass (OSG) dielectric are not damaged during processing.

BACKGROUND OF THE INVENTION

Generally, semiconductor devices include a plurality of circuits that form an integrated circuit including chips (e.g., chip back end of line, or "BEOL"), thin film packages and printed circuit boards. Integrated circuits (ICs) can be useful for computers and electronic equipment and can contain millions of transistors and other circuit elements that are fabricated on a single silicon crystal substrate. For the device to be functional, a complex network of signal paths will normally be routed to connect the circuit elements distributed on the surface of the device. Efficient routing of these signals across the device can become more difficult as the complexity and number of integrated circuits are increased. Thus, the formation of multilevel or multilayered interconnect schemes such as, for example, dual damascene wiring structures, have become more desirable due to their efficacy in providing high speed signal routing patterns between large numbers of transistors on a complex semiconductor chip. Within the interconnect structure, metal vias run perpendicular to the silicon substrate and metal lines run parallel to the silicon substrate.

Presently, interconnect structures formed on an integrated circuit chip consists of at least about 2 to 8 wiring levels fabricated at a minimum lithographic feature size designated about 1× (referred to as "thinwires") and above these levels are about 2 to 4 wiring levels fabricated at a width equal to about 2× and/or about 4× the minimum width of the thinwires (referred to as "fatwires"). In one class of structures, the thinwires are formed in a low dielectric constant (k) organosilicate glass (OSG) dielectric layer that includes atoms of Si, C, H and O, and the fatwires are made in a silicon dioxide dielectric layer having a dielectric constant of about 4.

For future technology nodes, the integration of porous (OSG) materials into Cu/ULK interconnect structures becomes necessary for maintaining the ITRS roadmap for increased performance. Essentially, since materials of dielectric constants in the range 2.7 to 3.1 are either in production (90 nm) or about to enter into production (65 nm), in order to continue to deliver performance enhancing interconnect solutions for various CMOS technologies, integrating ULK materials for beyond 65 nm node will be necessary. However, these materials of dielectric constant less than 2.7 are quite susceptible to plasma-induced chemical/physical modification ("damage") upon exposure to resist removal plasma ashing chemistries and typically manifest poor adhesion to interlevel diffusion barrier materials (SiC, SiCN, SiCNH, and etc.).

Figure 1A:
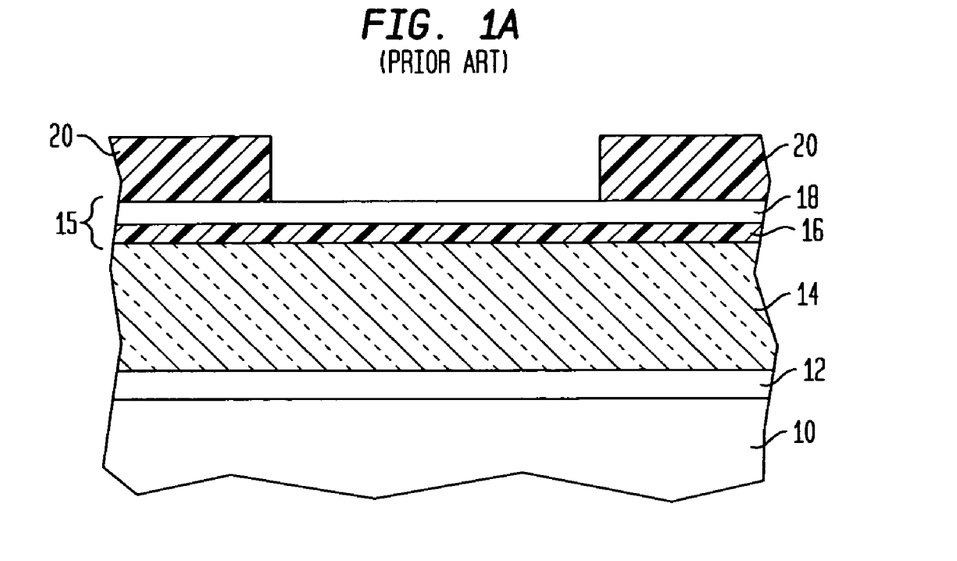
FIGS. 1A-1D are pictorial representations (through cross sectional views) showing the conventional dual damascene plasma processing scheme.

A typically prior art process for forming a dual damascene interconnect structure is shown, for example, in FIGS. 1A-1D. FIG. 1A shows the interconnect structure after providing a patterned photoresist 20 to a material stack 15 that comprises a hard mask 16 and an overlaying antireflective coating 18. The interconnect structure also includes an ULK OSG dielectric 14, a diffusion barrier 12 and a substrate layer 10. The substrate layer 10 may comprise a semiconductor substrate having one or more semiconductor devices located thereon, or it may comprise one of the lower interconnect levels which may have conductive features, i.e., wires and/or vias located therein.

Figure 1B:
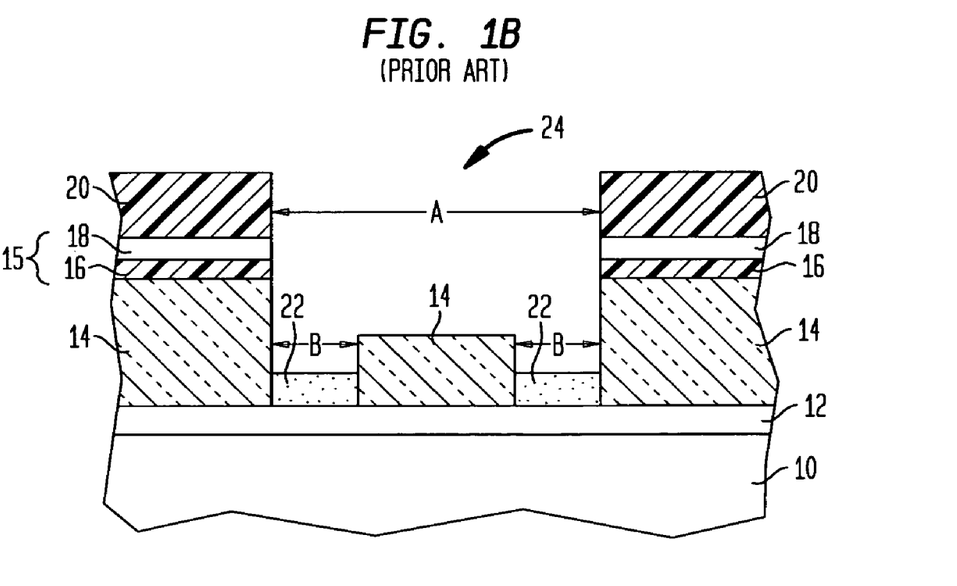

FIG. 1B shows the structure of FIG. 1A after transferring the pattern (via first and then line) from the patterned photoresist 20 into the material stack 15 and the underlying ULK OSG dielectric 14 and providing an organic fill material 22 within lower portions of a trench opening 24. The trench opening 24 includes an upper area A that is wider than a lower area B.

Figure 1C:
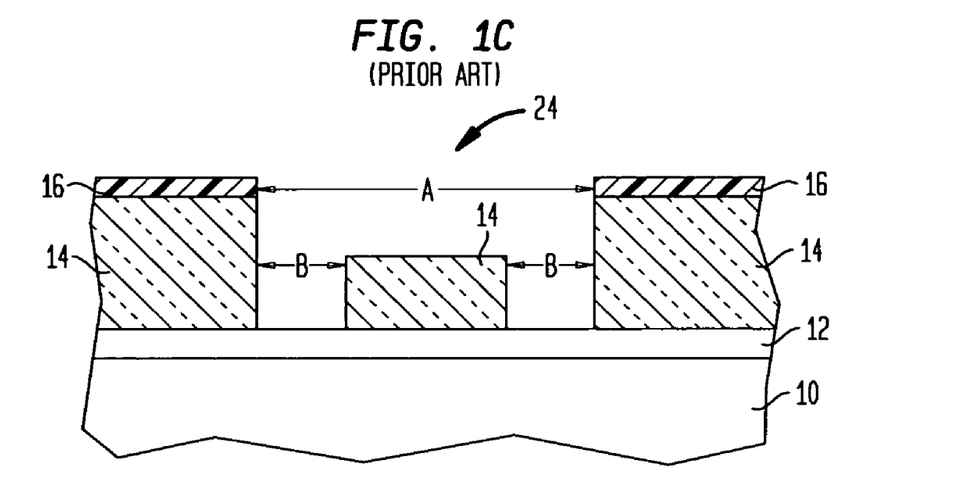
Figure 1D:
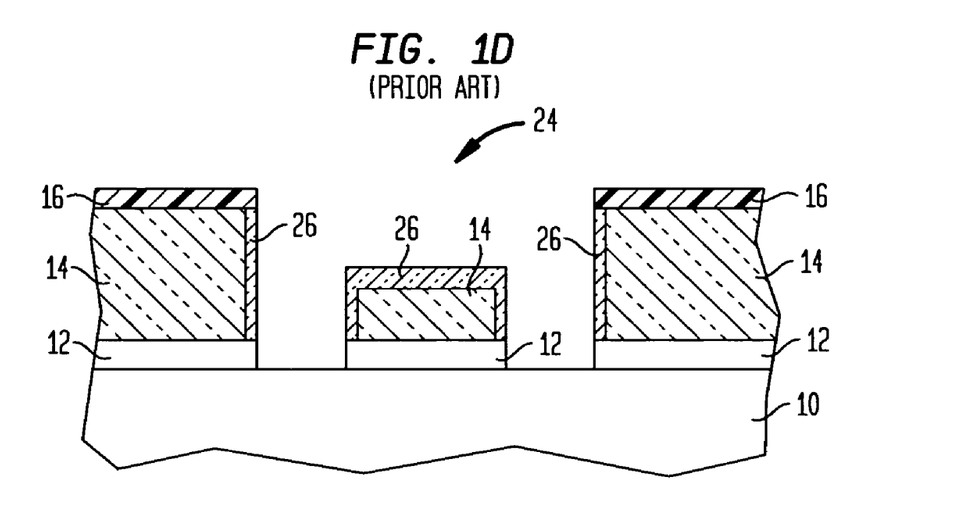

FIG. 1C shows the structure of FIG. 1B after performing an ashing step which removes the patterned photoresist 20, the ARC 18 and the organic fill material 22 from the interconnect structure. FIG. 1D shows the structure after opening the diffusion barrier 12 utilizing an etching process that is selective in removing the exposed portions of the diffusion barrier 12. It is noted that wall portions of the OSG dielectric 14 within the trench opening 24 are damaged. By 'damaged' it is meant that the wall portions of the OSG dielectric 14 within the trench opening 24 that are exposed to the ashing plasma are modified from an original composition to one that is more oxide- or oxynitride-like. The damaged portions are labeled as element 26 in FIG. 1D. The damaged portions 26 typically have a different (i.e., increased) dielectric constant as compared with the remaining portions of the OSG dielectric 14.

To address the issue of plasma-induced "damage" several alternative resist removal plasma ash chemistries (reducing plasmas) have been proposed. See, for example, U.S. Pat. No. 6,630,406. All of these alternative chemistries nonetheless do modify the OSG dielectric material to some degree increasing the film's dielectric constant and degrading the overall interconnect performance (though potentially at target for a given technology node).

Another approach utilizes alternative integration schemes (so-called "trench-first") to circumvent this issue whereby after patterning part of the line structure, all resist is removed (with the OSG dielectric still protected by various hard mask materials) and thereafter some hard mask material (metallic or non-metallic) serves as the pattern transfer layer. More details of one such alternative scheme can be found, for example, in U.S. Pat. No. 6,734,096 and U.S. patent application Ser. No. 11/034,480.

Such integration schemes, though successfully addressing the issue of plasma ash-induced ILD modification, sometimes offer a narrow single and dual damascene process window and they are generally quite expensive.

On the issue of interlevel dielectric (ILD) adhesion to the interlevel barrier material, this is addressed in several ways including the use of organic or inorganic adhesion promoters that chemically bind to both the ILD and diffusion barrier material thereby increasing the adhesive strength and overall mechanical integrity of the stack. In the case of organic adhesion promoters, however, the use of various ashing chemistries, while potentially capable of modifying porous OSG ILD films minimally, can consume the adhesion promoter weakening the mechanical strength of the stack and thereby degrading the reliability of the Cu/ULK interconnect structure.

In view of the drawbacks mentioned above with prior art processes of fabricating an interconnect structure which includes an OSG dielectric, there is a need for providing a new method of fabricating an interconnect structure wherein the wall portions of the OSG dielectric within a trench opening are protected such that no damage occurs thereto.

SUMMARY OF THE INVENTION

The present invention provides a method of fabricating an interconnect structure wherein a sacrificial polymeric layer is applied onto the exposed wall portions of an OSG dielectric and, if present, an organic adhesion promoter to address both of the issues mentioned hereinabove. Conventional single and dual damascene processing entails definition of the trench through etching of the hard mask layers and OSG film with the latter occurring selective to the diffusion barrier. The patterning resist material (single, bi, or tri-layer schemes) is subsequently removed and the final step ensuring metallic contact between metal-X+1 and the underlying X level requires etching of the interlevel diffusion barrier material. Such an approach will lead to some (or all) of the issues highlighted above. The inventive method entails permuting the order in which the resist strip and diffusion barrier open processes are performed, thereby enabling a thin polymeric layer to be deposited onto the exposed wall portions of OSG dielectric and, if present, the organic adhesion promoter protecting these films from modification during a subsequent ashing process.

For single damascene such a permutation is straight-forward, however for dual damascene, this requires the diffusion barrier etching process to be specially tailored so as to achieve sufficient selectivity to the exposed trench ILD material (and potentially exposed hard mask films dependent on whether or not the via-fill organic material located in the field is completely consumed during the barrier/via-fill etch process) while etching the via-fill material and diffusion barrier. Such a process is potentially feasible for OSG materials comprising SiCOH-based low k materials (porous and/or nonporous) and for hard mask materials comprising typical inorganic films (oxide, TEOS, oxynitride, nitride). Since via-fill materials are typically organic and the diffusion barrier is of a SiC type (SiC, SiCH, SiCNH), etching chemistries comprising specifically tailored fluorine: oxygen gas ratios (<4:1) can be employed to produce desired dual damascene trench profiles; enabling the deposition of the sacrificial polymeric layer for wall protection through a permutation of the diffusion barrier open and ashing steps.

This permutation, for both single and dual damascene, facilitates the deposition of a thin-polymeric layer onto the sidewall of the trenches coating the OSG dielectric and, if present, the organic adhesion promoter with this thin layer. This thin layer of polymer achieves two key functional advantages, namely: (1) protects the exposed wall portions of the OSG dielectric from the subsequent plasma ashing chemistries and hence "damage" and (2) protects the organic adhesion promoter from consumption during ashing. In this manner, the degree of physical and chemical modification induced by the plasma ashing chemistry onto the OSG dielectric is reduced allowing increased metal/ULK interconnect performance and furthermore, the mechanical integrity of the stack is maintained since the organic adhesion promoter is relatively unscathed.

The present invention thus provides an interconnect structure of, e.g., the dual damascene type, in which a sacrificial thin polymeric layer is deposited onto the exposed wall portions (including sidewalls and bottom, e.g., horizontal surfaces) of the OSG dielectric and, if present, the organic adhesion promoter during the diffusion barrier open step impeding the consumption of both materials in the subsequent ashing of the patterning materials. By protecting the exposed wall portions of at least the OSG dielectric, the original stoichiometry of the OSG dielectric is maintained, i.e., no damaged wall portions are formed, as is the case in the prior art process depicted in FIGS. 1A-D. It is noted that in embodiments where an organic adhesion promoter is present between the OSG dielectric and the diffusion barrier, the sacrificial polymeric layer also protects the exposed wall portions of the organic adhesion promoter such that after ashing and opening of the diffusion barrier the wall portions of the organic adhesion promoter are unscathed.

The present invention also provides an interconnect structure of improved RC electrical performance versus that of an interconnect structure built with conventional single or dual damascene processing. Also, the mechanical integrity of the OSG dielectric/diffusion barrier stack is improved.

In broad terms, the interconnect structure of the present application comprises:

an OSG dielectric including at least one conductive feature embedded therein, wherein wall portions of the OSG dielectric adjacent said at least one conductive feature have substantially the same chemical stoichiometry and dielectric constant as that of remaining portions of the OSG dielectric.

The interconnect structure of the present invention further includes an optional hard mask located on a portion of an upper surface of the OSG dielectric and a diffusion barrier located on a portion of a lower surface of the OSG dielectric. In some embodiments of the present invention; an organic adhesion promoter is present between the OSG dielectric and the diffusion barrier. In accordance with the present invention, the underlying organic adhesion promoter is also not damaged and, as such, the integrity of the diffusion barrier and the OSG dielectric is maintained.

In addition to the interconnect structure mentioned above, the present invention also provides a method of fabricating the same. In broad terms, the inventive method comprises:

providing a structure including a trench opening defining at least one via and line within a OSG dielectric material, said structure including a patterned stack comprising a hard mask, an antireflective coating and a photoresist located on an upper surface thereof, and an unopened diffusion barrier located beneath said OSG dielectric;

providing an opening in said diffusion barrier that is beneath said at least one via, wherein during said providing the opening a sacrificial polymeric material is formed on wall portions of said OSG dielectric;

removing said photoresist and said antireflective coating from said structure, wherein during said removing said sacrificial polymeric material is also removed; and filling said trench opening with at least a conductive material.

DETAILED DESCRIPTION OF THE INVENTION

The present invention, which provides a dual damascene process enabling minimal OSG dielectric modification and enhanced stack integrity, will now be described in greater detail by referring to the following discussion and drawings that accompany the present application. It is noted that the drawings of the present application showing the processing flow of a conventional process and the inventive process are provided for illustrative purposes and, as such, they are not drawn to scale.

The present invention which is directed to an interconnect structure useful for forming a semiconductor device is built with an alternative single and dual damascene processing sequence in which the diffusion barrier open precedes the removal of the resist layer(s). Permuting the sequence of these two steps facilitates improved target metal/ULK interconnect electrical (RC) performance (reduced leakage) and mechanical integrity of the stack. Both of these are achieved as a sacrificial polymeric layer is deposited onto exposed wall portions of the OSG dielectric and, if present, the organic adhesion promoter during the diffusion barrier open step. Thus, during the resist removal step, this sacrificial layer is removed rendering the OSG dielectric and organic adhesion promoter unscathed.

Reference is made to FIGS. 2A-2G which illustrate through cross sectional views the basic processing steps of the present invention. Specifically, the inventive method begins by first providing the structure 100 shown in FIG. 2A. The structure 100 shown in FIG. 2A comprises a substrate 50, a diffusion barrier 52 atop the substrate 50, an OSG dielectric 54 located above (either in direct contact with or separated by an organic adhesion promoter) the diffusion barrier 52, a hard mask 56 located atop the OSG dielectric 54, an antireflective coating 58 located on the hard mask 56 and a photoresist 60 located on the antireflective coating 58. An optional organic adhesion promoter 53 can be present between the diffusion barrier 52 and the OSG dielectric 54. The optional adhesion promoter 53 aids in forming a strong bond between the OSG dielectric and the diffusion barrier 52. An optional organic adhesion promoter can also be located between the OSG dielectric 54 and the hard mask 56. This later embodiment is not depicted in the drawings of the present application.

Figure 2A:
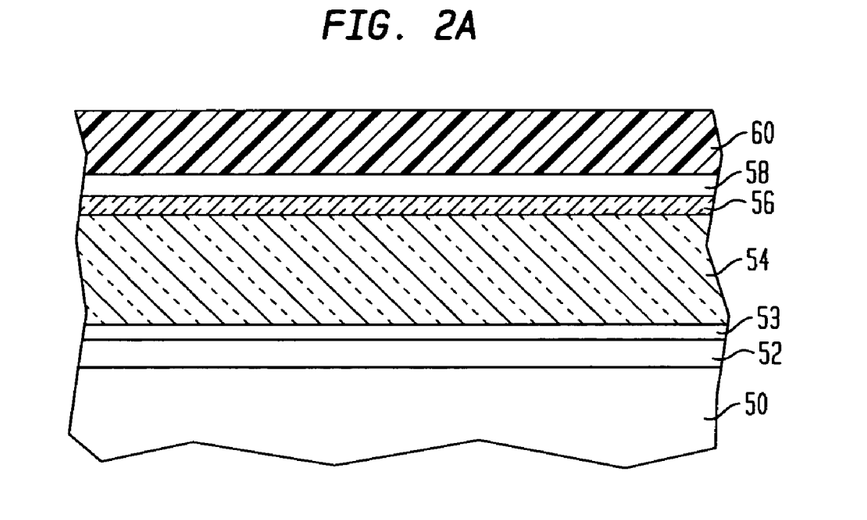
FIGS. 2A-2G are pictorial representations (through cross sectional views) showing the inventive dual damascene plasma processing scheme.

The term "substrate" when used in conjunction with substrate 50 includes a semiconducting material, an insulating material, a conductive material or any combination thereof including multilayered structures. Thus, for example, substrate 50 can be a semiconducting material such as Si, SiGe, SiGeC, SiC, GaAs, InAs, InP and other III/V or II/VI compound semiconductors. The semiconductor substrate 50 can also include a layered substrate such as, for example, Si/SiGe, Si/SiC, silicon-on-insulators (SOIs) or silicon germanium-on-insulators (SGOIs).

When substrate 50 is an insulating material, the insulating material can be an organic insulator, an inorganic insulator or a combination thereof including multilayers. When the substrate 50 is a conductive material, the substrate 50 may include, for example, polySi, an elemental metal, alloys of elemental metals, a metal silicide, a metal nitride and combinations thereof, including multilayers.

In some embodiments, the substrate 50 includes a combination of a semiconducting material and an insulating material, a combination of a semiconducting material and a conductive material or a combination of a semiconducting material, an insulating material and a conductive material.

When the substrate 50 comprises a semiconductor material, one or more semiconductor devices such as complementary metal oxide semiconductor (CMOS) devices can be fabricated thereon. For clarity, the one or more semiconductor devices are not shown in the drawings of the present application.

Notwithstanding the kind of substrate 50 employed, a diffusion barrier 52 such as an oxide, nitride and/or a dielectric comprising atoms of Si and C, with N, O and H being optional is formed on the substrate 50. The diffusion barrier 52 is formed utilizing a conventional deposition process including, for example, chemical vapor deposition (CVD), plasma enhanced chemical vapor deposition (PECVD), evaporation, chemical solution deposition and other like deposition processes. The thickness of the diffusion barrier 52 may vary depending on the type of materials employed, the number of materials used in forming the diffusion barrier, and the deposition process used. Typically, the diffusion barrier 52 has a thickness after deposition from about 20 to about 100 nm, with a thickness from about 35 to about 50 mm being even more typical.

In some embodiments, an optional organic adhesion promoter 53 is formed between the diffusion barrier 52 and the OSG dielectric 54. Although optional, it is preferred to employ the organic adhesion promoter 53 between layers 52 and 54 since such a layer provides a strong bond between the diffusion barrier 52 and the OSG dielectric 54. When present, the optional organic adhesion promoter 53 is formed utilizing a conventional deposition process such as, for example, spin-on coating, evaporation, CVD, PECVD, chemical solution deposition, dip coating, brush coating, immersion and other like deposition processes. The optional organic adhesion promoter 53 is typically an aliphatic or aromatic organic compound including atoms of C, H, Si, O and optionally F. Illustrative examples of suitable organic adhesion promoters 53 that can be employed in the present invention include, but are not limited to: alkoxysilanes, polyarylene ethers, polybenzoxazoles, etc. The thickness of the optional organic adhesion promoter 53 applied to the diffusion barrier 52 is typically from about 10 to about 100 nm, with a thickness from about 20 to about 50 nm being even more typical.

The OSG dielectric 54 comprises a single layer or multilayer dielectric material having a dielectric constant of about 3.0 or less. Preferably, the OSG dielectric 54 has a dielectric constant of less than about 2.8, with a dielectric constant of less than about 2.6 being more highly preferred. The OSG dielectric 54 can be porous and/or nonporous. When porous dielectric films are employed, the dielectric constant thereof is less than the nonporous version of the same dielectric film. Preferably, the OSG dielectric 54 is a porous material. When multilayer dielectric stacks are employed, a diffusion barrier, as described above, can be formed between each of the dielectrics within the multilayer stack.

Examples of OSG dielectrics 54 that can be employed in the present invention include, but are not limited to: silicon-containing materials such as a composition of Si, C, O and H (SiCOH) also called C doped oxide (CDO), and organosilicate glass (OSG).

The OSG dielectric 54 is typically deposited using plasma enhanced chemical vapor deposition (PECVD). In addition to PECVD, the present invention also contemplates that the OSG dielectric 54 can be formed utilizing chemical vapor deposition (CVD), high-density plasma (HDP) deposition, pulsed PECVD, spin-on application, or other related methods. The thickness of the OSG dielectric 54 deposited may vary; typical ranges for the deposited OSG dielectric 54 are from about 50 nm to about 1 μm, with a thickness from 100 to about 600 nm being more typical.

Typically, the OSG dielectric 54 is a SiCOH dielectric that is deposited using the processing techniques disclosed in co-assigned U.S. Pat. Nos. 6,147,009, 6,312,793, 6,441,491, 6,437,443, 6,541,398, 6,479,110 B2, and 6,497,963, the contents of which are incorporated herein by reference. Specifically, the SiCOH dielectric film is formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming a SiCOH dielectric material. The present invention yet further provides for mixing the first precursor with an oxidizing agent such as $O_2$, $CO_2$ or a combination thereof, thereby stabilizing the reactants in the reactor and improving the uniformity of the OSG dielectric 54.

In addition to the first precursor, a second precursor (gas, liquid or vapor) comprising atoms of C, H, and optionally O, F and N can be used. Optionally, a third precursor (gas, liquid or gas) comprising Ge may also be used.

Preferably, the first precursor is selected from organic molecules with ring structures comprising SiCOH components such as 1,3,5,7-tetramethylcyclotetrasiloxane ("TMCTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), and related cyclic and non-cyclic silanes, siloxanes and the like.

The second precursor that may be used in forming a SiCOH low k dielectric is a hydrocarbon molecule. Although any hydrocarbon molecule such as, for example, ethylene, may be used, preferably the second precursor is selected from the group consisting of hydrocarbon molecules with ring structures, preferably with more than one ring present in the molecule or with branched chains attached to the ring. Especially useful are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$"). Also useful are molecules containing branched tertiary butyl (t-butyl) and isopropyl (i-propyl) groups attached to a hydrocarbon ring; the ring may be saturated or unsaturated (containing C=C double bonds), and multicyclic hydrocarbons such as bicycloheptadiene. The third precursor may be formed from germane hydride or any other reactant comprising a source Ge.

In a preferred embodiment of the present invention, the SiCOH dielectric film, which is used as the OSG dielectric 54, may be deposited using a method the includes the step of providing a parallel plate reactor, which has a conductive area of a substrate chuck between about 85 $cm^2$ and about 750 $cm^2$, and a gap between the substrate and a top electrode between about 1 cm and about 12 cm. A high frequency RF power is applied to one of the electrodes at a frequency between about 0.45 MHz and about 200 MHz. Optionally, an additional low frequency power can be applied to one of the electrodes.

The conditions used for the deposition step may vary depending on the desired final dielectric constant of the SiCOH dielectric film. Broadly, the conditions used for providing a stable dielectric material comprising elements of Si, C, O and H that has a dielectric constant of about 2.8 or less include: setting the substrate temperature at between about 200° C. and about 425° C.; setting the high frequency RF power density at between about 0.1 W/$cm^2$ and about 2.5 W/$cm^2$; setting the first liquid precursor flow rate at between about 100 mg/min and about 5000 mg/min, optionally setting the second liquid precursor flow rate at between about 50 mg/min to about 10,000 mg/min; optionally setting the third liquid precursor flow rate at between about 25 mg/min to about 4000 mg/min; optionally setting the inert carrier gases such as helium (and/or argon) flow rate at between about 50 sccm to about 5000 sccm; setting the reactor pressure at a pressure between about 1000 mTorr and about 7000 mTorr; and setting the high frequency RF power between about 75 W and about 1000 W. Optionally, a low frequency power may be added to the plasma between about 30 W and about 400 W. When the conductive area of the substrate chuck is changed by a factor of X, the RF power applied to the substrate chuck is also changed by a factor of X.

When an oxidizing agent is employed in the present invention, it is flown into the PECVD reactor at a flow rate between about 10 sccm to about 1000 sccm.

While liquid precursors are used in the above example, it is known in the art that the organosilicon gas phase precursors (such as trimethylsilane) can also be used for the deposition. A porogen can be included during the deposition of OSG dielectric 54 that causes subsequent pore formation within the OSG dielectric 54 during a subsequent curing step. The curing of the OSG dielectric 54 can be after deposition of the OSG dielectric 54, or after deposition of the hard mask 56.

In a preferred embodiment of the present invention, the OSG dielectric 54 formed at this point of the present invention contains a matrix of a hydrogenated oxidized silicon carbon material (SiCOH) comprising atoms of Si, C, O and H in a covalently bonded tri-dimensional network and having a dielectric constant of not more than about 2.8. The tri-bonded network may include a covalently bonded tri-dimensional ring structure comprising Si—O, Si—C, Si—H, C—H and C—C bonds. The OSG dielectric 54 may comprise F and N and may optionally have the Si atoms partially substituted by Ge atoms. The OSG dielectric 54 may contain molecular scale voids (i.e., nanometer-sized pores) of between about 0.3 to about 50 nanometers in diameter, and most preferably between about 0.4 and about 10 nanometers in diameter, further reducing the dielectric constant of the OSG dielectric 54 to values below about 2.0. The nanometer-sized pores of the OSG dielectric 54 occupy a volume of between about 0.5% and about 50% of a volume of the material.

When the OSG dielectric 54 is a SiCOH dielectric, it typically comprises between about 5 and about 40 atomic percent of Si; between about 5 and about 45 atomic percent of C; between 0 and about 50 atomic percent of 0; and between about 10 and about 55 atomic percent of H.

After forming the OSG dielectric 54, the hard mask 56 is then formed atop the OSG dielectric 54. The hard mask 56 can be formed in the same reactor chamber, with or without breaking vacuum, as that used to form the OSG dielectric 54. Alternatively, different reactor chambers using at least one different deposition process as that of the OSG dielectric 54 can be used in forming the hard mask 56.

The hard mask 56 includes, an oxide, a nitride, an oxynitride, or an inorganic SiCOH-type material including atoms of Si, C, H and optionally O. Multilayers of these materials are also contemplated herein. The hard mask 56 is formed utilizing a conventional deposition process including, for example, CVD, PECVD, evaporation, chemical solution deposition and other like deposition processes. The overall thickness of the as deposited hard mask 56 may vary depending on the type of hard mask material employed, the number of layers that constitute the hard mask 56 and the technique used in forming the same. Typically, the hard mask 56 has a thickness from about 30 to about 150 nm, with a thickness from about 30 to about 100 nm being more typical.

Following deposition of the hard mask 56, an antireflective coating (ARC) 58 is deposited. The ARC 58 may be deposited using the same or different, preferably the same, reactor chamber as that of the other layers shown in FIG. 2A. Alternatively, the ARC 58 may be spin coated. The ARC 58 is preferably comprised of a conventional organic antireflective coating material, because a larger etch process window is obtained with an organic ARC. The ARC 58 typically has a thickness from about 40 to about 150 nm.

Next, a photoresist 60 is formed on the ARC 58 by spin coating of a conventional resist material. Although spin coating is specifically mentioned other deposition processes such as CVD or PECVD can also be used.

Figure 2B:
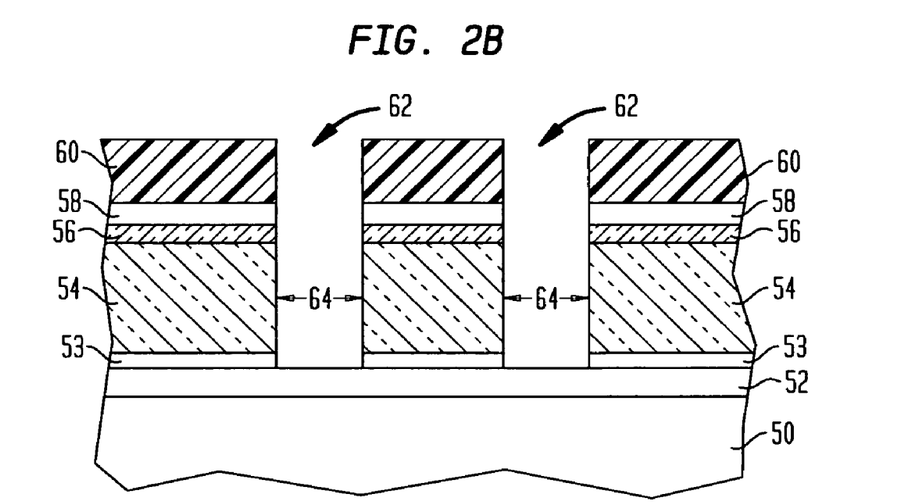

The present invention comprises a via first transfer process followed by a line transfer process. These processing steps will be described in greater detail by referring to FIGS. 2B-2D. The via transfer step, includes patterning the photoresist 60 by lithography to include at least one via opening 62. The lithographic step includes exposing the applied resist material to a pattern of radiation and developing the exposed resist material utilizing a conventional resist developer. The at least one via opening 62 is first transferred to the ARC 58, then to the hard mask 56, then to the OSG dielectric 54, and then the optional organic adhesion promoter 53, stopping on the diffusion barrier 52. In FIG. 2B, reference numeral 64 denotes a via. The pattern transfer is achieved utilizing one or more etching steps which are described in greater detail herein below. The patterned photoresist 60 and the ARC 58 are typically removed utilizing a conventional stripping process well known in the art.

Figure 2C:
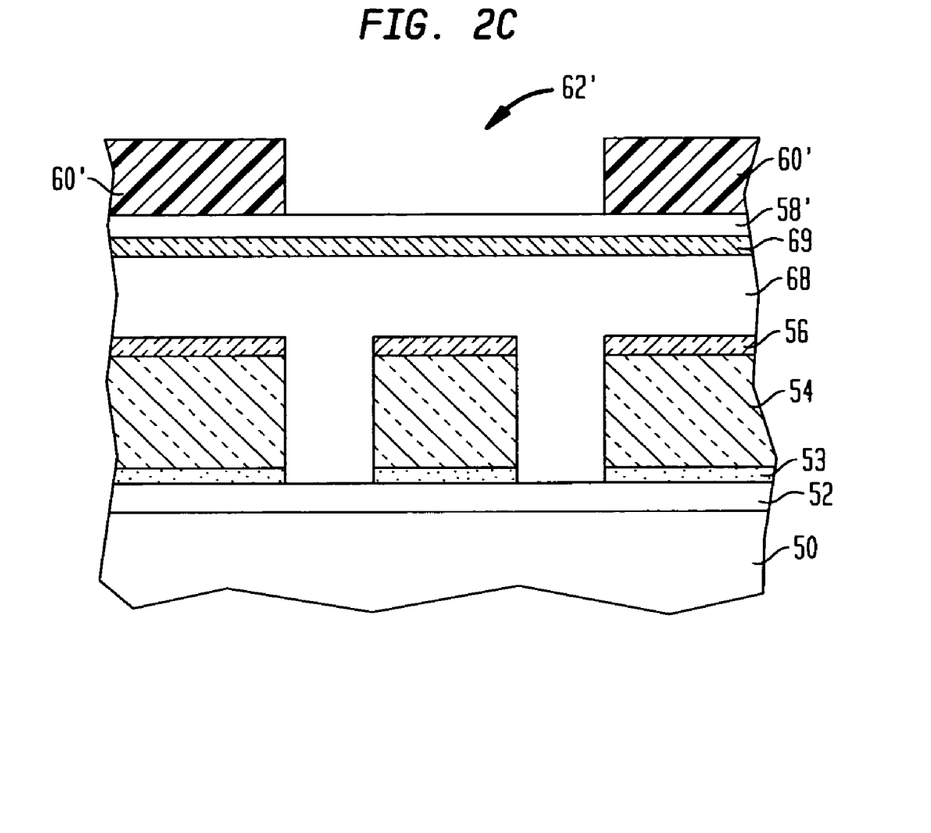

FIG. 2C shows the post litho line level structure formed subsequent to the via etch process described above. This entails filling the via 64 with a planarizing organic fill material 68 followed by depositing an inorganic material (oxide, nitride, oxynitride type material) 69 by PECVD or spin-on methods. Next, a second ARC 58', and a second photoresist 60' are formed by conventional deposition techniques. The second photoresist 60' is patterned by lithography to include a line pattern. The lithographic step includes exposing the applied resist material to a pattern of radiation and developing the exposed resist material utilizing a conventional resist developer. In the present invention, a second opening (or trench) 62' is formed into the second photoresist 60' which is used to forming the line or trench 66.

Figure 2D:
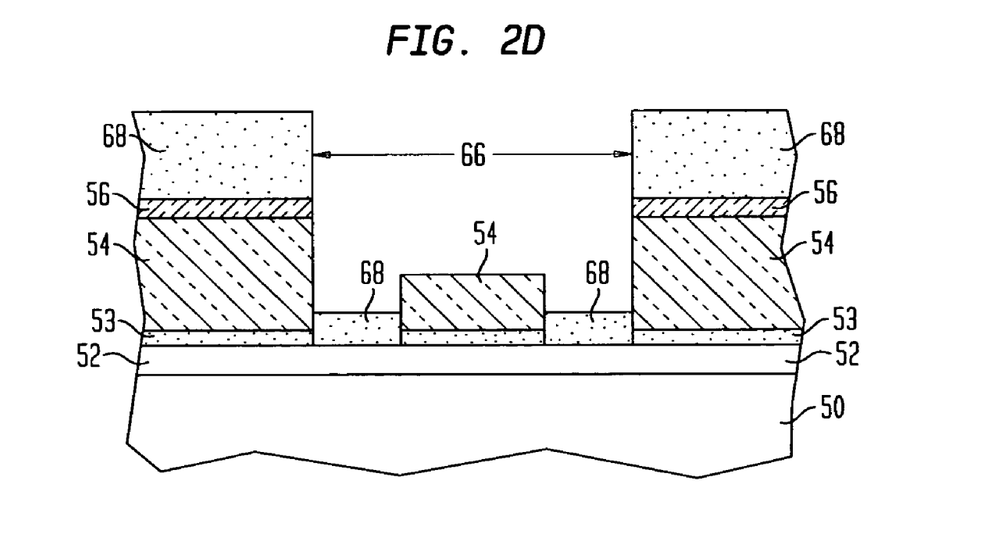

FIG. 2D shows the structure that is formed after transferring the line (trench) pattern into the underlying layers, prior to stripping the planarizing organic material 68 and opening the diffusion barrier 52 to stop on the underlying substrate 50. In accordance with the present invention, the ARC 58', inorganic layer 69, and planarizing organic material 68 are etched to transfer the line pattern. The line pattern is then transferred into the dielectric 54 with the planarizing organic material 68 serving as a masking layer. Prior to stripping (ashing) the organic fill material 68 and opening the barrier layer 52 creates a structure depicted in FIG. 2D. Thee second photoresist 60', the second ARC 58' and the inorganic material 69 are removed from the structure after transferring the line 66 into the dielectric 54.

The organic fill material 68 described above is formed by a conventional deposition process including, for example, spin-on coating, evaporation, CVD, PECVD, chemical solution deposition and other like deposition techniques. The organic fill material 68 comprises an aliphatic or aromatic organic compound, which typically includes atoms of C, H, O, Si and F. Examples of suitable organic fill material 68 that can be used in the present invention include, but are not limited to: polyhydroxystyrene systems.

The pattern transfer (via and line etch described above) includes the use of one or more etching processes that are selective in providing the via and lines patterns to the OSG dielectric 54. A dry etching process such as reactive ion etching, plasma etching, or ion beam etching may be used. A chemical wet etching process can also be used in providing the vias 64 and the line 66 within the OSG dielectric 54.

After forming the vias 64 and line 66 within the OSG dielectric 54, an etch back process is performed that thins, i.e., recesses, the organic fill material 58 located in the field (the patterned photoresist would have been removed previously during the etching of the so-called tri-layer (Resist/Inorganic Material/Organic Via fill) materials, while completely removing the organic fill material 68 from the structure (See, FIG. 2D). The etch back process includes the use of any chemical etching process that is selective in removing the material of both the patterned photoresist 60 and the organic fill material 68. For example, any oxygen (CO, $CO_2$, $O_2$, etc), nitrogen ($N_2$, $NH_3$ etc), or hydrogen-containing ($H_2$, $NH_3$ etc) gas or any combinations of these can be used as the etchant in performing the etch back process.

Figure 2E:
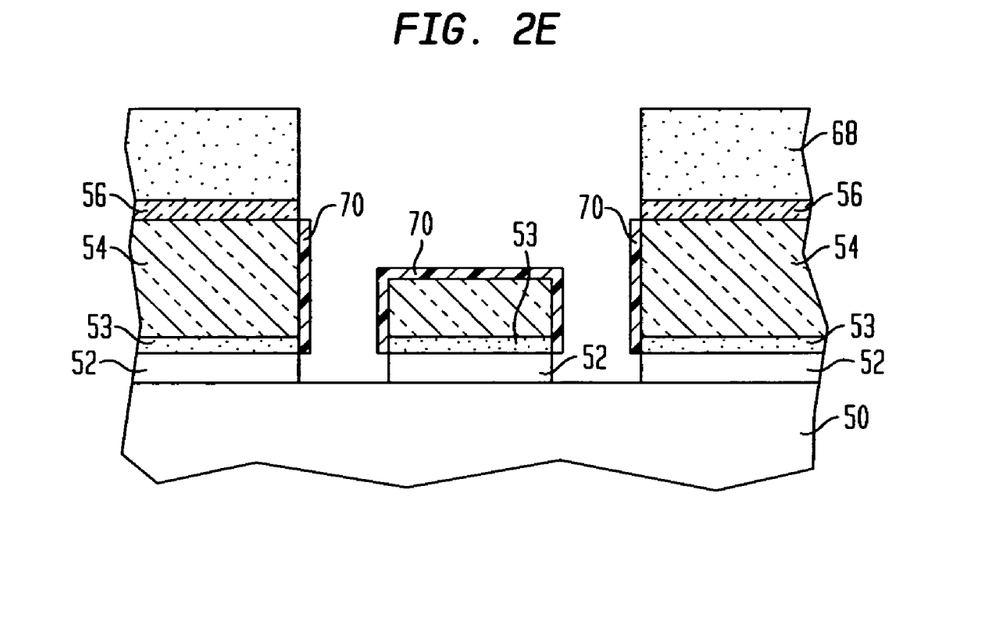

At this point of the invention and as shown, for example, in FIG. 2E, the exposed surfaces of the diffusion barrier 52 within the vias 64 are opened utilizing a reactive ion etching process which includes organic chemistries. Typically, the reactive ion etching includes any fluorine and oxygen-containing chemistries. During the opening of the diffusion barrier 52, a sacrificial polymeric material 70 is simultaneously formed on all exposed wall portions of the OSG dielectric 54 and, if present, the organic adhesion promoter 53. The sacrificial polymeric material 70 employed in the present invention protects the exposed wall portions of the OSG dielectric 54 within the via and line openings as well as the wall portions of the organic adhesion promoter 53, if present. The sacrificial polymeric material 70 employed in the present invention comprising atoms of C and H, with F atoms being optional. Illustrative examples of such polymeric materials that can be employed in the present invention include, but are not limited to: $C_xH_y$ or $C_xH_yF_z$ type species (where x, y, z are non-zero integers).

The thickness of the sacrificial polymeric material 70 applied to the wall portions of the OLD dielectric 53 and, if present, the organic adhesion promoter 53 is typically from about a few nm to about 20 nm, with a thickness from about a few nm to about 5 nm being even more typical. The presence of the polymeric material layer 70 protects the OSG dielectric 54 and, if present, the organic adhesion promoter 53 during the removal of the remaining patterned photoresist 60 and the ARC 58. That is, the sacrificial polymeric layer 70 ensures that the wall portions of the OSG dielectric 54 have substantially the same stoichiometeric composition as that of inner portions of the OSG dielectric 54. Also, the sacrificial polymeric material 70 maintains the integrity of OSG dielectric 54/adhesion promoter 53 stack.

Figure 2F:
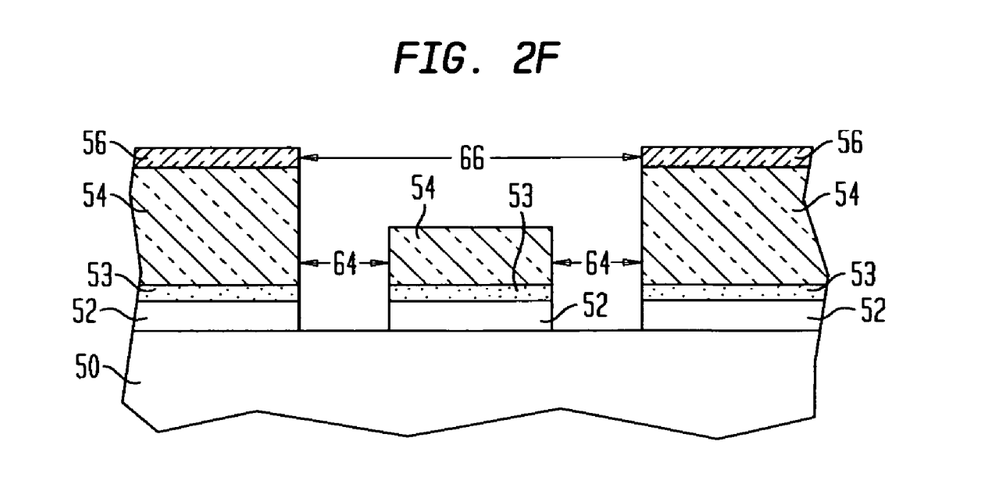

The remaining organic fill material 68 is then removed utilizing a stripping process which is capable of removing this organic material layer from the structure. Since the sacrificial polymeric material 70 is also comprised of organic components, this step of the present invention also removes the sacrificial polymeric material 70 from the structure. The resultant structure is shown in FIG. 2F. Typically, this step of the present invention includes the use of an oxygen plasma process, e.g., ash process. The oxygen plasma process includes providing a plasma of oxygen from an oxygen-containing source. Such oxygen plasma processing and conditions are well known to those skilled in the art. Typically, the oxygen plasma process is performed using the following conditions: low, medium, or high pressure and low, medium or high power density in situ or ex situ O-containing plasmas ($O_2$, CO, $CO_2$, etc) at room or elevated substrate temperatures.

Figure 2G:
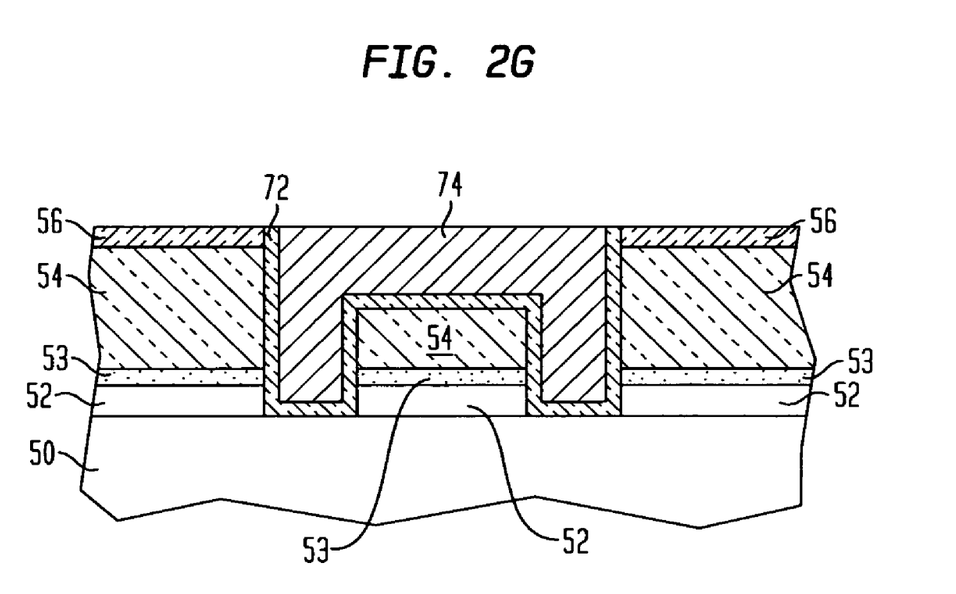

FIG. 2G shows the structure that is formed after at least one liner 72 and a conductive material 74 have been formed into the structure shown in FIG. 2F. The at least one liner 72 is formed on all exposed surfaces (vertical and horizontal) within the openings created above. The at least one liner 72 is formed by any deposition process including, but not limited to: CVD, PECVD, sputtering, chemical solution deposition or plating. The at least one liner 72 is comprised of any material that can serve as a barrier to prevent a conductive material 74 from diffusing there through. Illustrative examples of such barrier materials include a refractory metal, such as Ta, Ti, W, Ru, or nitrides thereof, e.g., TaN, TiN, WN. The at least one liner 72 may also comprise TiNSi. The thickness of the at least one liner 72 is typically from about 1 to about 60 nm, with a thickness from about 5 to about 40 nm being more typical.

In some embodiments, as shown, it is possible to remove the at least one liner 72 from the bottom wall of the via 64 to provide an interconnect structure having an open via bottom. When an open via bottom structure is desired, an ion bombardment or other like directional etching process is employed.

Next, a conductive material 74 is deposited within the openings. The conductive material 74 comprises polySi, a conductive metal, an alloy comprising at least one conductive metal, a conductive metal silicide or combinations thereof. Preferably, the conductive material 74 is a conductive metal such as Cu, W, or Al. In one highly preferred embodiment, the conductive material 74 is comprised of Cu or CuAl alloy. The conductive material 74 is formed within the openings utilizing a conventional deposition process including, but not limited to: CVD, PECVD, sputtering, chemical solution deposition or plating. After deposition, a planarization process can be employed such that the upper surface of the conductive material 74 is substantially coplanar with either the upper surface of the OSG dielectric 54 or, as shown, the upper surface of the hard mask 56. The conductively filled opening can be referred to herein as a conductive feature that is embedded within the OSG dielectric 54.

While the present invention has been particularly shown and described with respect to preferred embodiments thereof, it will be understood by those skilled in the art that the foregoing changes in forms and details may be made without departing from the spirit and scope of the present application. It is therefore intended that the present invention not be limited to the exact forms and details described and illustrated herein, but fall within the scope of the appended claims.

What is claimed is:

1. A method of forming an interconnect structure comprising:
   providing a structure including a trench opening defining at least one via and line within an organosilicate glass (OSG) dielectric material, said structure including a patterned stack comprising a hard mask, an antireflective coating and a photoresist located on an upper surface thereof, and an unopened diffusion barrier located beneath said OSG dielectric;
   providing an opening in said diffusion barrier which is beneath said at least one via, wherein during said providing the opening a sacrificial polymeric material is simultaneously formed on wall portions of said OSG dielectric;
   removing said photoresist and said antireflective coating from said structure, wherein during said removing said sacrificial polymeric material is also removed; and
   filling said trench opening with at least a conductive material.

2. The method of claim 1 wherein said providing said structure includes forming said via first and then forming said line.

3. The method of claim 1 wherein said providing an opening comprising a reactive ion etching process which includes organic chemistries.

4. The method of claim 3 wherein said sacrificial polymeric material comprises atoms of C and H.

5. The method of claim 4 wherein said sacrificial polymeric material further comprises F atoms.

6. The method of claim 1 wherein said removing said photoresist and said antireflective coating from said structure comprises an oxygen plasma process.

7. The method of claim 1 wherein said filling said trench opening includes forming a liner within the trench opening and forming said conductive material on said liner.

8. The method of claim 7 wherein said liner is removed from a bottom wall portion of said via prior to forming said conductive material.

9. The method of claim 1 further comprising providing an organic adhesion promoter between said OSG dielectric and said diffusion barrier.

* * * * *